(12) United States Patent
Chen

(10) Patent No.: US 9,627,290 B2
(45) Date of Patent: Apr. 18, 2017

(54) BUMP STRUCTURE DESIGN FOR STRESS REDUCTION

(75) Inventor: Hsien-Wei Chen, Sinying (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 71 days.

(21) Appl. No.: 13/313,867

(22) Filed: Dec. 7, 2011

(65) Prior Publication Data

US 2013/0147034 A1   Jun. 13, 2013

(51) Int. Cl.
| | |
|---|---|
| *H01L 23/31* | (2006.01) |
| *H01L 23/29* | (2006.01) |
| *H01L 23/00* | (2006.01) |
| *H01L 23/525* | (2006.01) |

(52) U.S. Cl.
CPC ........ *H01L 23/3192* (2013.01); *H01L 23/293* (2013.01); *H01L 23/3171* (2013.01); *H01L 24/05* (2013.01); *H01L 24/06* (2013.01); *H01L 24/13* (2013.01); *H01L 24/14* (2013.01); *H01L 23/3114* (2013.01); *H01L 23/525* (2013.01); *H01L 24/16* (2013.01); *H01L 2224/0401* (2013.01); *H01L 2224/05022* (2013.01); *H01L 2224/05027* (2013.01); *H01L 2224/05147* (2013.01); *H01L 2224/05166* (2013.01); *H01L 2224/05181* (2013.01); *H01L 2224/05186* (2013.01); *H01L 2224/05541* (2013.01); *H01L 2224/05572* (2013.01); *H01L 2224/05647* (2013.01); *H01L 2224/05655* (2013.01); *H01L 2224/0603* (2013.01); *H01L 2224/06051* (2013.01); *H01L 2224/06131* (2013.01); *H01L 2224/06179* (2013.01); *H01L 2224/11849* (2013.01); *H01L 2224/13022* (2013.01); *H01L 2224/13541* (2013.01); *H01L 2224/1403* (2013.01); *H01L 2224/14051* (2013.01); *H01L 2224/14131* (2013.01); *H01L 2224/14179* (2013.01); *H01L 2224/16225* (2013.01); *H01L 2224/16227* (2013.01); *H01L 2924/00014* (2013.01); *H01L 2924/3511* (2013.01)

(58) Field of Classification Search
CPC ... H01L 23/544; H01L 23/562; H01L 23/585; H01L 21/78; H01L 2924/01079
USPC .......................................................... 257/737
See application file for complete search history.

(56) References Cited

U.S. PATENT DOCUMENTS

| | | | |
|---|---|---|---|
| 6,586,323 B1* | 7/2003 | Fan .......... | H01L 24/11 257/E21.508 |
| 2001/0031548 A1* | 10/2001 | Elenius et al. ................ | 438/613 |
| 2003/0087475 A1* | 5/2003 | Sterrett et al. ................ | 438/108 |
| 2005/0121804 A1* | 6/2005 | Kuo et al. ..................... | 257/781 |
| 2006/0038291 A1* | 2/2006 | Chung et al. ................. | 257/738 |
| 2006/0103020 A1* | 5/2006 | Tong et al. .................... | 257/738 |
| 2007/0158788 A1* | 7/2007 | Yang ............................. | 257/620 |
| 2009/0160063 A1* | 6/2009 | Okumura et al. ............. | 257/773 |
| 2009/0283903 A1* | 11/2009 | Park .............................. | 257/737 |
| 2010/0007017 A1* | 1/2010 | Wei et al. ..................... | 257/737 |

(Continued)

*Primary Examiner* — Thao X Le
*Assistant Examiner* — Geoffrey Ida
(74) *Attorney, Agent, or Firm* — Haynes and Boone, LLP

(57) ABSTRACT

Low stress bumps can be used to reduce stress and strain on bumps bonded to a substrate with different coefficients of thermal expansion (CTEs) from the die. The low stress bumps include multiple polymer layers. More than one type of bump is coupled to a die, with low stress bumps placed on areas subjected to high stress.

20 Claims, 5 Drawing Sheets

(56) References Cited

U.S. PATENT DOCUMENTS

2010/0140752 A1* 6/2010 Marimuthu et al. .......... 257/621
2011/0186987 A1* 8/2011 Wang et al. .................. 257/737
2012/0043654 A1* 2/2012 Lu et al. ....................... 257/737

* cited by examiner

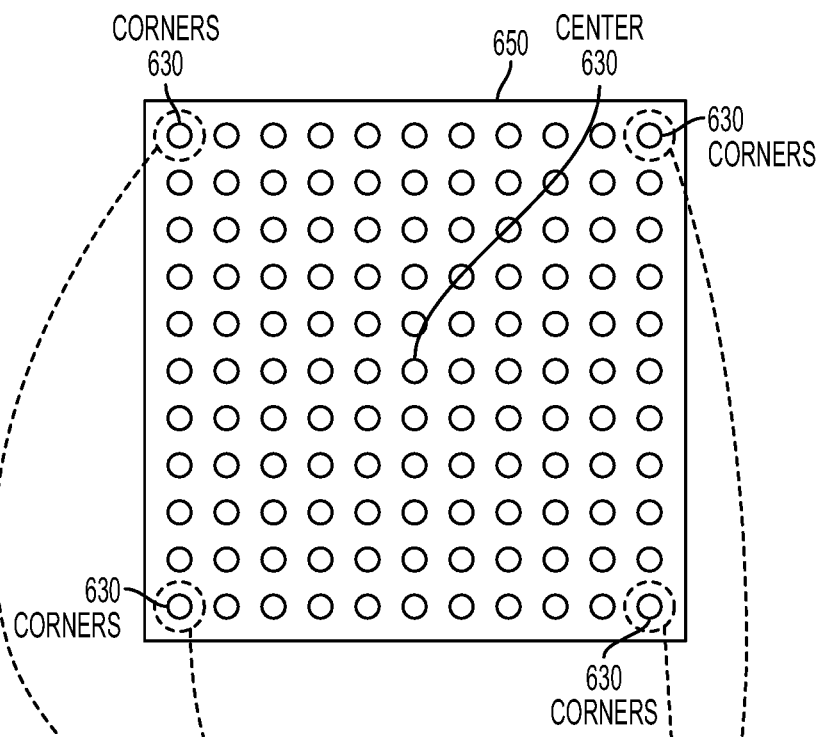
FIG. 6A
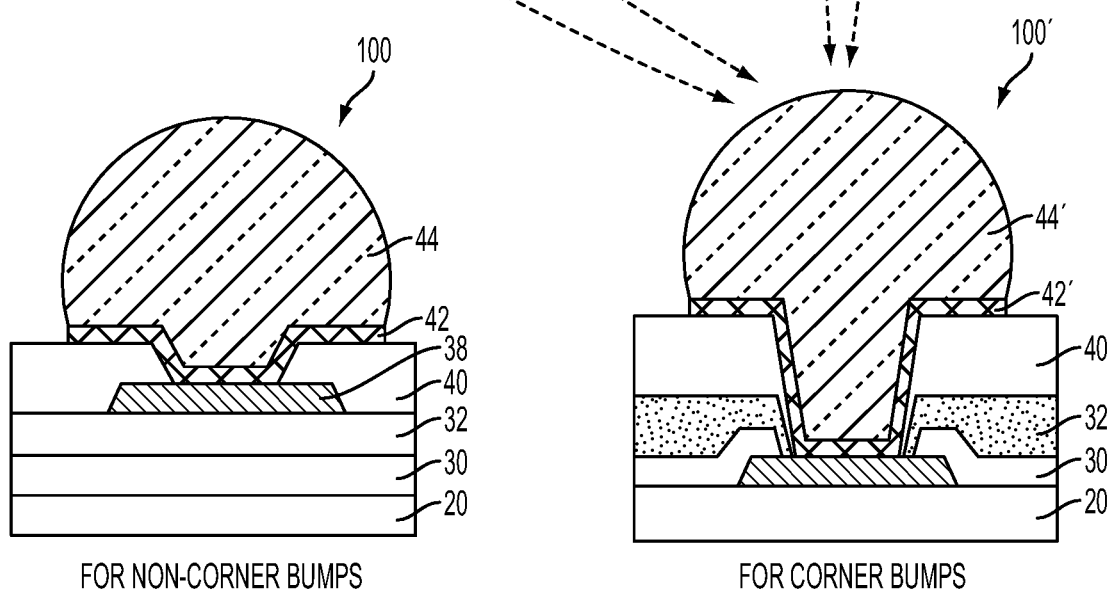
FOR NON-CORNER BUMPS
FIG. 6B
FOR CORNER BUMPS
FIG. 6C

BUMP STRUCTURE DESIGN FOR STRESS REDUCTION

BACKGROUND

In the formation of wafer-level chip scale package (WLCSP) structures, integrated circuit devices, such as transistors, are first formed at the surface of a semiconductor substrate in a wafer. Interconnect structures are then formed over the integrated circuit devices and solder balls are mounted on the surface of the wafer. Afterwards, the wafer is sawed into dies.

The dies may be bonded to printed circuit boards (PCBs) directly. The dies that were directly bonded to PCBs were typically small dies. Accordingly, the stresses applied on the solder balls that bond the dies to the respective PCBs were relatively small. Recently, increasingly larger dies are bonded to PCBs. The stresses applied on the solder balls thus become increasingly greater. Consequently, mechanisms for reducing the stresses are needed. Underfill is a mechanism for reducing stress on solder balls. However, underfill is not suitable for WLCSP in protecting the solder balls. If the underfill is applied, the bonding between the dies and the PCBs is not re-workable. Dies with underfill cannot be removed from the respective PCB in the situations that the dies are defective. As a result, the entire PCBs bonded to the failed dies become defective.

BRIEF DESCRIPTION OF THE DRAWINGS

For a more complete understanding of the embodiments, and the advantages thereof, reference is now made to the following descriptions taken in conjunction with the accompanying drawings, in which:

FIG. 6A shows a bottom view of a die, in accordance with some embodiments.

FIG. 6B shows a cross-sectional view of a non-corner bump (including center bump), in accordance with some embodiments.

FIG. 6C shows a cross-sectional view of a corner bump, in accordance with some embodiments.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A wafer level chip scale package (WLCSP) is provided in accordance with some embodiments. Variations of the embodiments are discussed. Throughout the various views and illustrative embodiments, like reference numbers are used to designate like elements.

Figure 1:
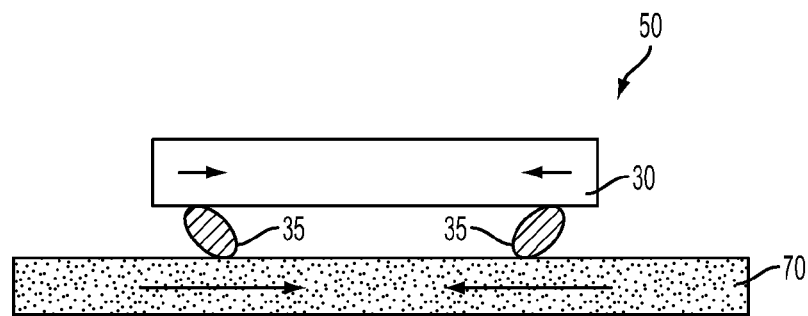
FIG. 1 shows a wafer-level chip scale package (WLCSP) being bonded to a substrate, in accordance with some embodiments.

FIG. 1 shows a WLCSP 50 being bonded to a substrate 70, in accordance with some embodiments. WLCSP 50 includes a semiconductor die 30 and a number of bumps 35. FIG. 1 shows that bumps 35 are distorted by stress and strain after the WLCSP 50 and substrate 70, such as a printed circuit board (PCB), are cooled following the bonding process. The distortion of bump 35 is a result of a severe mismatch of coefficients of thermal expansion (CTE) between the semiconductor die 30 and substrate 70. For example, a semiconductor die (or chip) 30 might have CTE at a value, such as 3 ppm/° C., which is lower than the CTE of a PCB, such as 15 ppmr C. During the bonding process, the temperatures of WLCSP 50 and the substrate 70 could have been raised to about 260° C. After the bonding process, both the substrate 70 and the bonded WLCSP 50 are cooled down. The large mismatch of CTEs of substrate 70 and the die 30 would result in distortion, or strain, of bumps 35, as shown in FIG. 1. Such strain in bumps 35 could cause bumps 35 to crack and affect the yield of the bonded products. The large mismatch of CTEs of substrate 70 and the die 30 may also result in delamination at an interface between the bumps 35 and an underlying dielectric layer (not shown) in die 30. Interfacial delamination causes reliability and yield issues.

Figure 2A:
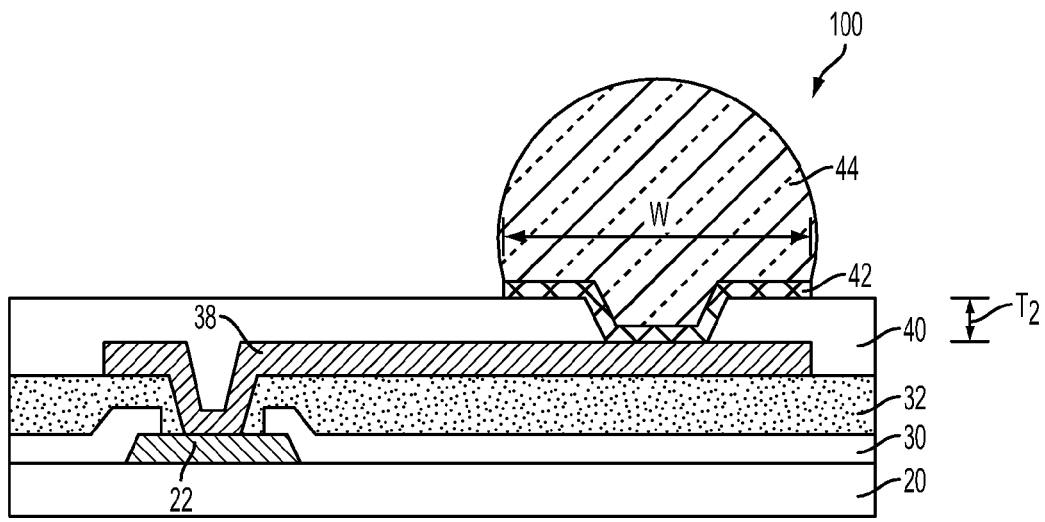
FIG. 2A illustrates a portion of a die of a WLCSP, in accordance with some embodiments.

FIG. 2A illustrates a portion of a die 100, which is a part of a WLCSP, in accordance with some embodiments. Die 100 may include substrate 20, which may be a semiconductor substrate, such as a silicon substrate, although it may include other semiconductor materials such as silicon germanium, silicon carbon, gallium arsenide, or the like. Active devices, such as transistors (not shown), may be formed at the surface of substrate 20. Interconnect structures (not shown), which include metal lines and vias (not shown) formed therein and electrically coupled to the semiconductor devices, are formed over substrate 20. The metal lines and vias may be formed in dielectric layers, which may be made of various dielectric materials, such as low-k dielectric layers having dielectric constants (k values) less than about 3.5. In some embodiments, the dielectric layers include an extreme low-k dielectric layer having k values less than about 2.5. One or more of the dielectric layers may be made of at least one material, such as silicon oxide, e.g., undoped silicate glass (USG), boron-doped silicate glass (BSG), phosphor-doped silicate glass (PSG), boron-phosphor-doped silicate glass (BPSG), or the like, silicon oxynitride, silicon nitride, and/or any combinations thereof. In some embodiments, a multiple-layer dielectric may be used as one of the dielectric layers. The formation methods may include chemical vapor deposition (CVD), plasma-enhanced CVD (or PECVD), spin-on, and other applicable methods.

Metal pad 22 is formed over the interconnect structure. Metal pad 22 may comprise aluminum, copper, silver, gold, nickel, tungsten, alloys thereof, and/or multi-layers thereof. Metal pad 22 may be electrically coupled to the semiconductor devices, for example, through the underlying interconnect structure. Passivation layer 30, and a first polymer layer 32 over passivation layer 30, may be formed to cover edge portions of metal pad 22. The passivation layer 30 is formed to protect the integrated circuits formed in substrate 20 and also the edge portions of metal pad 22. The passivation layer 30 may also be a hermetic layer to prevent moisture from contacting the devices. In an exemplary embodiment, passivation layer 30 is formed of dielectric materials such as silicon oxide, silicon nitride, or multi-layers thereof. The passivation layer 30 may have a thickness in a range from about 3,000 Å to about 15,000 Å. The formation methods may include chemical vapor deposition (CVD), plasma-enhanced CVD (or PECVD), and other applicable methods.

The first polymer layer 32 is used to reduce the stress of forming additional structures, such as post-passivation interconnect (PPI) described below and/or metal bumps, on substrate 20. The first polymer layer 32 may be made of polyimide or polybenzoxazole (PBO). First polymer layer 32 may also be made of other types of polymers. The first polymer layer 32 may have a thickness in a range from about 10,000 Å (or 1 μm) to about 100,000 Å (or 10 μm). The formation methods may include spin-on, and other applicable methods. An opening is formed in passivation layer 30 and first polymer layer 32 to expose metal pad 22.

Post-passivation interconnect (PPI) 38 is formed afterwards. PPI 38 may include a first portion over polymer layer 32, and a second portion extending into the opening in passivation layer 30 and polymer layer 32. The second portion of PPI 38 is electrically coupled to, and may contact, metal pad 22. PPI 38 may be made of copper. PPI 38 may have a thickness in a range from about 10,000 Å (or 1 μm) to about 100,000 Å (or 10 μm). In some embodiments, PPI 38 includes a diffusion barrier layer and a seed layer. The diffusion barrier layer may also function as an adhesion layer (or a glue layer), in some embodiments. The diffusion barrier layer may be formed of tantalum nitride, although it may also be formed of other materials such as titanium nitride, tantalum, titanium, or the like. In some embodiments, the thickness of the diffusion barrier layer is in a range from about 200 Å to about 2000 Å. In some embodiments, the formation methods include physical vapor deposition (PVD) (or sputtering). The seed layer may be a copper seed layer formed on the diffusion barrier layer. The copper seed layer may be formed of copper or one of copper alloys that include silver, chromium, nickel, tin, gold, and combinations thereof. The thickness of the copper seed layer is in a range from about 2000 Å to about 8000 Å, in accordance with some embodiments.

In some embodiments, PPI 38, such as a PPI structure made of copper, is deposited by a plating process. An optional nickel (Ni) layer may be deposited over the copper layer. The Ni layer prevents the formation of an inter-metallic compound, which is formed between copper and solder. The optional Ni layer may have a thickness in a range from about 1,000 Å to about 50,000 Å.

A second polymer layer 40 may be formed over PPI 38. The second polymer layer 40 is also used to reduce stress of forming additional structures, such as metal bumps, on substrate 20. The second polymer layer 40 may be made of polyimide or polybenzoxazole (PBO). Second polymer layer 40 may also be made of other types of polymers. The second polymer layer 40 may have a thickness in a range from about 10,000 Å (or 1 μm) to about 100,000 Å (or 10 μm). The formation methods may include spin-on, and other applicable methods.

An under-bump metallurgy (UBM) layer 42 is formed to extend into an opening in second polymer layer 40, wherein UBM layer 42 is electrically coupled to PPI 38, and may contact a pad in PPI 38. Bump 44 is formed on the UBM layer 42. Die 100 may include a plurality of bumps 44. In one embodiment, bump 44 is a solder ball formed and/or placed over UBM 42 and reflowed. In some embodiments, bump 44 is a metal pillar formed on the UBM 42. In some embodiments, the thickness of the UBM layer 42 is in a range from about 2 μm to about 10 μm.

In some embodiments, UBM layer 42 includes a diffusion barrier layer and a seed layer. The diffusion barrier layer may also function as an adhesion layer (or a glue layer), in some embodiments. The diffusion barrier layer may be formed of tantalum nitride, although it may also be formed of other materials such as titanium nitride, tantalum, titanium, or the like. In some embodiments, the thickness of the diffusion barrier layer is in a range from about 200 Å to about 2000 Å. In some embodiments, the formation methods include physical vapor deposition (PVD) (or sputtering). The seed layer may be a copper seed layer formed on the diffusion barrier layer. The copper seed layer may be formed of copper or one of copper alloys that include silver, chromium, nickel, tin, gold, and combinations thereof. The thickness of the copper seed layer is in a range from about 2000 Å to about 8000 Å, in accordance with some embodiments. In some embodiments, UBM layer 42 includes a diffusion barrier layer formed of Ti and a seed layer formed of Cu. In some embodiments, both the diffusion barrier layer and the seed layer are deposited by physical vapor deposition (PVD) (or sputtering) methods.

UBM layer 42 may further include a copper layer. The copper layer may have a thickness in a range from about 10,000 Å (or 1 μm) to about 100,000 Å (or 10 μm). In some embodiments, the copper layer is deposited by a plating process. An optional nickel (Ni) layer may be deposited over the copper layer. The Ni layer could prevent the formation of inter-metallic compound, which is formed between copper and solder. The optional Ni layer may have a thickness in a range from about 1,000 Å to about 5,000 Å.

Solder bump 44 is then deposited onto UBM layer 42. In some embodiments, solder bump 44 has a thickness in a range from about 100 μm to about 400 μm. Solder bump 44 may be plated or mounted on UBM layer 42. FIG. 2A shows the solder bump 44 is rounded, which is a result of reflow.

As shown in FIG. 2A, the width of the UBM layer under bump 44 is W and the thickness of the second polymer layer 40 is $T_2$. As mentioned above, the second polymer layer 40 is used to reduce stress (or as a cushion) for additional structures, such as UBM 42 and bump 44, on substrate 20. A thicker second polymer layer (or larger $T_2$) 40 would provide better stress reduction. The width of the UBM, W, is also an indicator of bump stress and strain. Wider UBM (or larger W) would allow the formation of a larger bump 44. Stress or strain exerted by a larger bump is larger than by smaller bump.

Figure 2B:
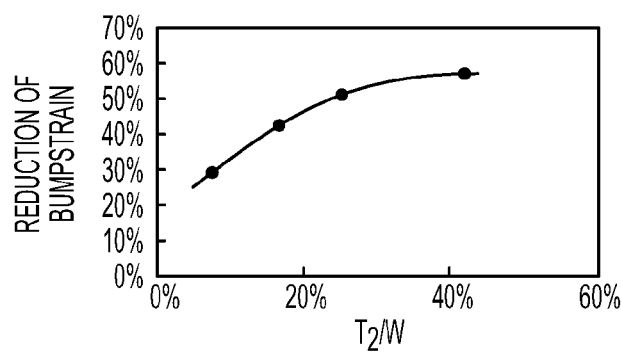
FIG. 2B illustrates a diagram of reduction of bump strain as a function of a ratio of polymer thickness to width of a bump, in accordance with some embodiments.

FIG. 2B illustrates a diagram of simulated reduction of bump strain (or strain induced in a bump) as a function of $T_2/W$, in accordance with some embodiments. The simulation results show that the higher $T_2/W$ would reduce bump strain. Significant reduction (about 30% to about 58%) is observed at a $T_2/W$ ratio in a range from about 8% to about 41%. The results in FIG. 2B suggests that bump strain reduction can be achieved by increasing $T_2$ (thickness of the second passivation layer) and/or reducing W (width of UBM layer). However, $T_2$ cannot be unlimitedly increased, because thicker $T_2$ makes the form of WLCSP 50 undesirable for thin applications. Further, when $T_2$ is too large (too thick) or the W is too small (i.e., a small bump), bump 44 could contain voids, which could affect the capability of bump 44 to bond properly with substrate 70. Therefore, it is desirable to seek alternative ways to reduce strain in bumps and interfacial delamination to improve reliability and yield.

Figure 3:
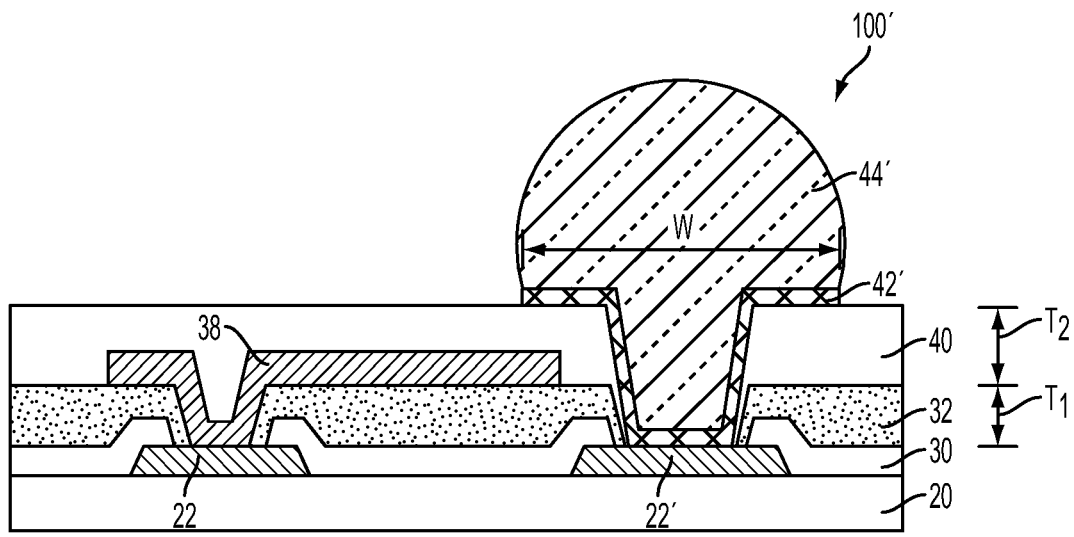
FIGS. 3-5 illustrate various embodiments of bump structures of a WLCSP, in accordance with some embodiments.

FIG. 3 illustrates a portion of a die 100', which is a part of a WLCSP, in accordance with some embodiments. Die 100' of FIG. 3 is similar to die 100 of FIG. 2A, with the exception that the opening used to form the UBM layer 42' and the bump 44' is etched through the first polymer layer 32 to allow the UBM layer 42' and bump 44' to come in contact with metal pad 22', which is at the same level as metal pad 22. Metal pad 22' may be a top metal layer or a redistribution layer (RDL). In some embodiments, another passivation layer is beneath the metal pad 22.

FIG. 3 shows that the width of bump 44' is still W and the thickness of first polymer layer is $T_1$. However, by forming the bump 44' into the bump opening, which is etched into both the first and the second polymer layers, bump 44' uses both the first and second polymer layers as cushion. The total thickness of polymer layers used to reduce the stress of UBM layer 42' and bump 44' is $T_1$ (thickness of first polymer layer 32)+$T_2$, which is greater than $T_2$. UBM layer 42' for bump 44' comes in contact with metal pad 22', instead of PPI 38. The connection with bump 44' needs to go through metal pad 22'.

Figure 4:
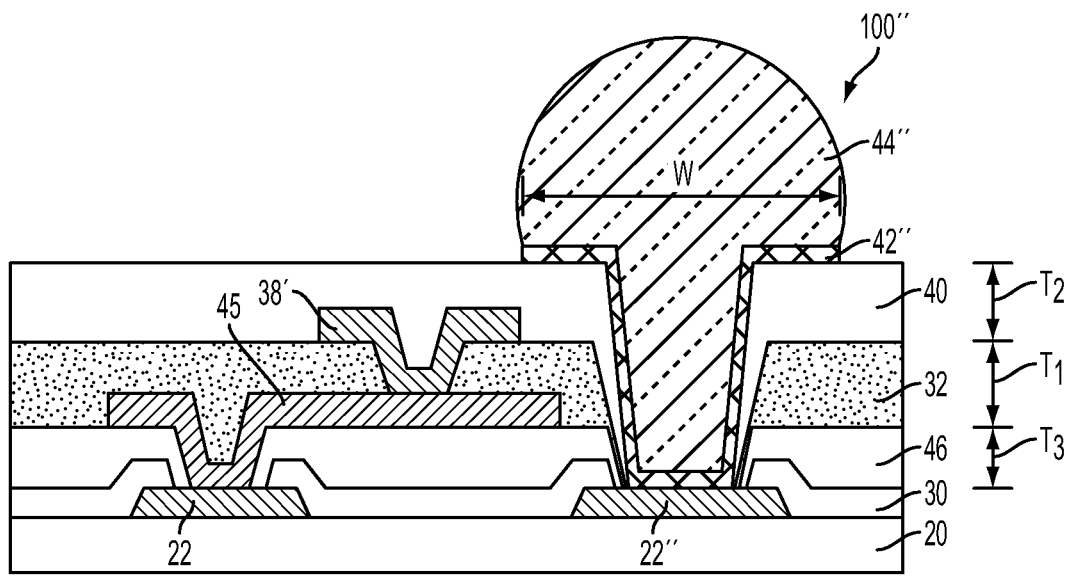

FIG. 4 illustrates a portion of a die 100", which is a part of a WLCSP, in accordance with some embodiments. Die 100" of FIG. 4 is similar to die 100' of FIG. 3, with the exception that there is an additional polymer layer (the third polymer layer) 46 and an additional PPI layer 45. The third polymer layer 46 may be made of polyimide or polybenzoxazole (PBO). Third polymer layer 46 may also be made of other types of polymers. The third polymer layer 46 may have a thickness in a range from about 10,000 Å (or 1 μm) to about 100,000 Å (or 10 μm). The formation methods may include spin-on, and other applicable methods.

The function of PPI layer 38 in previous figures has been divided into two layers, PPI layer 38' and PPI layer 45. The opening used to form the UBM layer 42" and the bump 44" is etched through the third polymer layer 45 to allow the UBM layer 42" and bump 44" to come in contact with metal pad 22". FIG. 4 shows that the width of bump 44" is still W. However, the total thickness of polymer layers used to reduce the stress of UBM layer 42" and bump 44" is $T_1+T_2+T_3$, which is greater than $T_2$.

Figure 5:
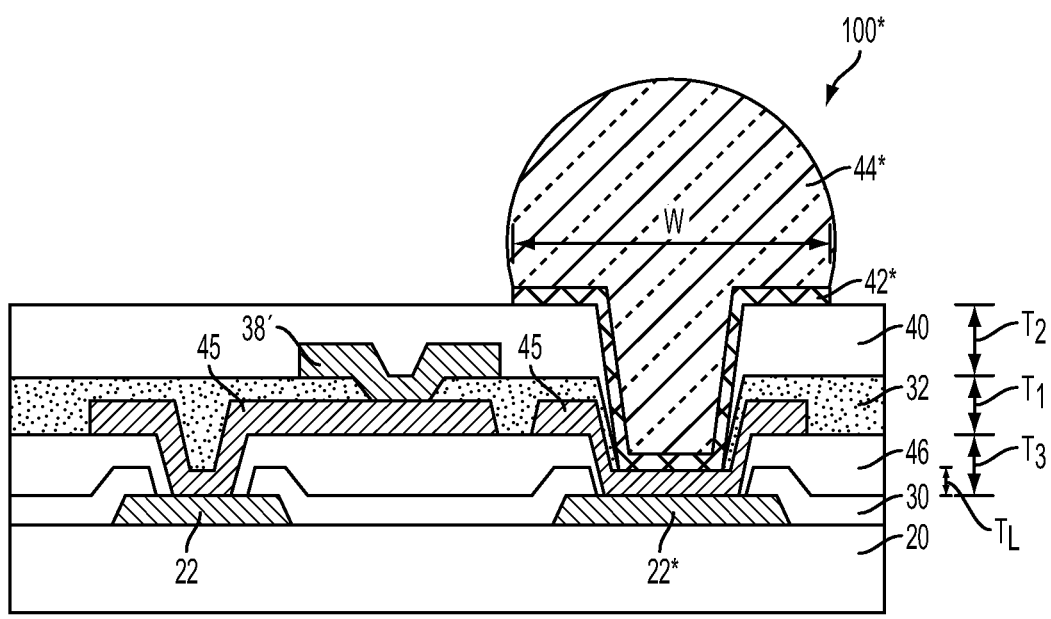

FIG. 5 illustrates a portion of a die 100*, which is a part of a WLCSP, in accordance with some embodiments. Die 100* of FIG. 5 is similar to die 100" of FIG. 4, with the exception that the UBM layer 42* is formed over the PPI layer 45, which is deposited in the opening for bump 44*. The PPI layer 45 comes in contact with metal pad 22*. In this embodiment, the first polymer 32 fills a portion of opening surrounding the UBM layer 42* and metal bump 44*. The thickness of the PPI layer 45 in the opening for forming the bump 44* is $T_L$. The thickness of polymer layers used to cushion the UBM layer 42* and the metal bump 44* is $T_1+T_2+T_3-T_L$. The UBM layer 42* and the metal bump 44* are protected by the first polymer 40 and the second polymer 32. The bumps in FIGS. 4 and 5 may have lower stress and strain than bumps in FIG. 3. Bumps in FIGS. 3-5 may have stress and strain lower than bumps in FIG. 2A.

The processes involved in forming the openings for lower stress bumps, such as bumps on dies 100', 100", and 100* described above, would be different from the processes involved in bumps 100. For example, only the second polymer layer 40 is etched in forming bumps 100. In contrast, additional polymer layers, such as the first polymer layer 32 and/or the third polymer layer 46, may be etched to form the openings for bumps 100', 100", and 100*. In addition, the electrical connection to the reduced stress bumps, such as bumps 100', 100", and 100*, is different from bump 100. In some embodiments, the ratio of total polymer thickness under a bump to the width of the UBM layer is in a range from about 0.1 (10%) to about 0.4 (40%). In some other embodiments, the ratio of total polymer thickness under a bump to the width of the UBM layer is in a range from about 0.15 (15%) to about 0.5 (50%). In some embodiments, the width of the UBM layer is about the same as the width of bump 100.

FIG. 6A shows a bottom view 600 of a die 650, in accordance with some embodiments. Die 650 has a number of bumps 630, such as $630_{Center}$ (center or non-corner bumps) and $630_{Corners}$ (corner bumps), as shown in FIGS. 6B and 6C, in accordance with some embodiments. For die 650, the strain of bumps near the center of die, such as bump $630_{Center}$, is lower than strain of bumps at the corner of die, such as bumps $630_{Corners}$. Therefore, it is possible to design and make bumps that are at low stress locations, such as bump $630_{Center}$ or other non-corner bumps, to be regular bumps, such as bumps 100. The bumps at locations that are under high stress, such as corner bumps, may be formed of bumps with reduced stress, such as bumps 100', 100", and 100* shown in FIGS. 3-5, to reduce stress.

Figure 7:
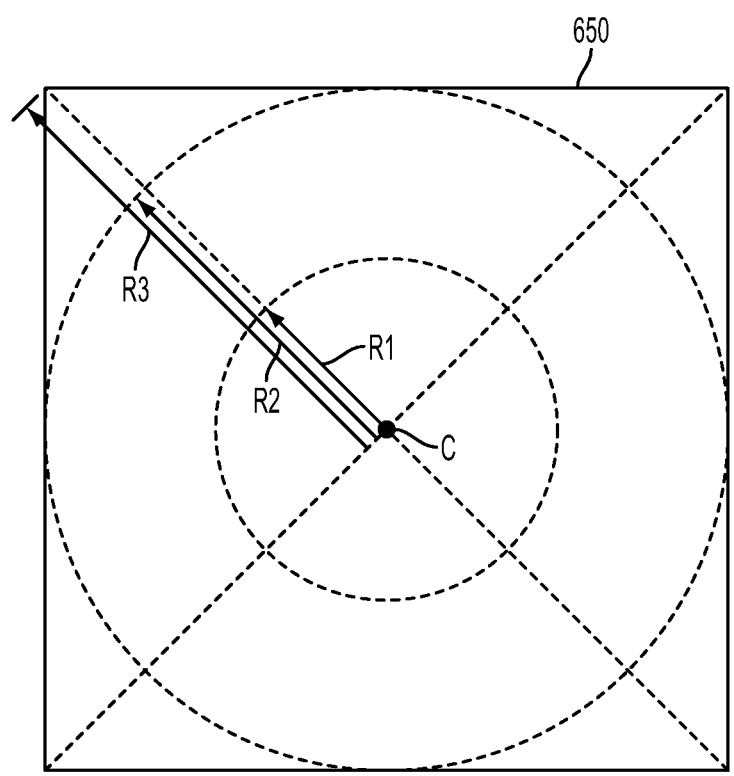
FIG. 7 shows outline of die, in accordance with some embodiments.

FIG. 7 shows outline of die 650, in accordance with some embodiments. As described above, the surface of die 650 is populated with bumps (not shown). The center of die 650 is marked as "C". The stress and strain of bumps on die 650 depend on the distance from the center of die 650 (or C), which is also called distance to neutral point (DNP). The farther the distance between a bump and the center of die 650, the greater the stress and strain of the bump are. The corner bumps, bumps $630_{Corners}$, described above are at a distance $R_3$ from C. $R_3$ is the farthest possible distance from the center of die 650. As a result, corner bumps, $630_{Corners}$, have the highest stress and strain. Therefore, they have the highest risk of bump crack and interfacial delamination. FIG. 7 shows a ring with a radius of $R_1$ and another ring with a radius of $R_2$, where $R_3>R_2>R_1$. The bumps inside ring $R_1$ have the lowest stress and strain. The bumps between rings $R_1$ and $R_2$ have stress and strain higher than the bumps inside ring $R_1$. The bumps outside ring $R_2$, including corner bumps $630_{Corners}$, have the highest stress and strain on die 650. The design of bumps on die 650 may depend on the locations of the bumps on die 650 and also depend on stress and strain levels of different products.

In some embodiments, die 650 has two types of bumps. Bumps outside ring $R_2$ are in one design and have stress and strain lower than bumps inside ring $R_2$. In some other embodiments, die 650 has three types of bumps. Bumps outside ring $R_2$ are in a first design and bumps between rings $R_2$ and $R_1$ are in a second design. Bumps inside ring $R_1$ are in a third design. Since $R_3>R_2>R_1$, the stress and strain of the first design are greater than the second design. Similarly, the stress and strain of the second design are greater than the third design. In yet some other embodiments, a single type of bumps with low stress are populated on die 650.

The embodiments of novel bump structures described above have low stress. The low stress bumps can be used to reduce stress and strain on bumps bonded to a substrate with different coefficients of thermal expansion (CTEs) from the die. The low stress bumps include multiple polymer layers. More than one type of bump could be coupled to a die, with low stress bumps placed on areas subjected to high stress.

In accordance with some embodiments, a bump structure is provided. The bump structure includes a semiconductor substrate and a metal pad over the semiconductor substrate. The bump structure also includes a first polymer layer over the metal pad, and a second polymer layer over the first polymer layer. The bump structure further includes a bump formed in an opening etched through the first and the second polymer layers, and an under-bump metallurgy (UBM) layer is disposed between the bump and the metal pad.

In accordance with some other embodiments, a bump structure is provided. The bump structure includes a semiconductor substrate and a metal pad over the semiconductor substrate. The bump structure also includes a first polymer layer over the metal pad, and a second polymer layer over the first polymer layer. The bump structure further includes a third polymer layer over the second polymer layer and a bump formed in an opening etched through the first, the second, and the third polymer layers, An under-bump metallurgy (UBM) layer is disposed between the bump and the metal pad.

In accordance with yet some other embodiments, a wafer-level chip scale package (WLCSP) is provided. The WLCSP includes a semiconductor substrate of a die, and a plurality of bump structures on the die. A first portion of the plurality of bump structures within a first distance from a center of the die has a first bump structure. A second portion of the plurality of bump structures between the first distance and a second distance from the center has a second bump structure, and the second distance is larger than the first distance. The second bump structure has lower stress and strain than the first bump structure.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A semiconductor device, comprising:
   a first metal pad directly on a top surface of a substrate;
   a passivation layer directly disposed on the top surface of the substrate and on a top surface of the first metal pad;
   a first polymer layer over the first metal pad and the passivation layer, wherein the first polymer layer is in direct contact with the first metal pad;
   a second polymer layer over the first polymer layer, wherein the second polymer layer does not directly contact the first metal pad;
   a third polymer layer over the second polymer layer; and
   a bump formed in an opening through the first polymer layer, the second polymer layer and the third polymer layer, wherein the second polymer layer extends into the opening, the third polymer layer extends into the opening and a portion of the second polymer layer within the opening is in direct contact with the first polymer layer;
   a second metal pad spaced a distance from the first metal pad, the second metal pad directly on the top surface of the substrate, and wherein the passivation layer is disposed directly on the top surface of the second metal pad;
   a first post-passivation interconnect (PPI) on the second metal pad, wherein a first portion of the first PPI interposes the first and the second polymer layers such that the first PPI interfaces the top surface of the first polymer layer and a bottom surface of the second polymer layer
   an under-bump metallurgy (UBM) layer is disposed between the bump and the metal pad, wherein the UBM layer is disposed between sidewalls of the bump and the second polymer layer.

2. The semiconductor device of claim 1, wherein a ratio of total thickness of the first and the second polymer layers to a width of the UBM layer is in a range from about 0.15 to about 0.5.

3. The semiconductor device of claim 1 wherein the passivation layer has a first interface with the first metal pad, a second interface with a bottom surface of the first polymer layer, and a third interface with a sidewall of the first polymer layer.

4. The semiconductor device of claim 1 further comprising a second portion of the first PPI which extends into an opening in the second polymer layer to contact the first portion of the first PPI and wherein the second portion of the first PPI interposes the third and the second polymer layers such that the second portion of the first PPI interfaces the top surface of the second polymer layer and a bottom surface of the third polymer layer.

5. The semiconductor device of claim 1, wherein the third polymer layer is between the bump and the second polymer layer in the opening.

6. The semiconductor device of claim 1, wherein a ratio of total thickness of the first, the second, and the third polymer layers to a width of the UBM layer disposed on the first bond pad is in a range from about 0.15 to about 0.5.

7. The semiconductor device of claim 1, wherein the semiconductor substrate is part of a die and the bump is located at corners of the die, and wherein other bumps near the center of the die are different from the bump located at corners of the die.

8. The semiconductor device of claim 1, wherein the semiconductor substrate has active devices disposed below the top surface of the substrate.

9. A semiconductor device, comprising:
   a semiconductor substrate;
   a first metal pad and a second metal pad, coplanar with the first metal pad, over the semiconductor substrate;
   a passivation layer disposed over the first and second metal pads;
   a first polymer layer over the first and second metal pads and the passivation layer, wherein the first polymer layer includes a first opening and a second opening;
   a post passivation interconnect (PPI) disposed on the first metal pad and in the first opening of the first polymer layer, wherein a first portion of the PPI is disposed on a top surface of the first polymer layer adjacent the first opening;
   a second polymer layer over the first polymer layer, interfacing the top surface of the first polymer layer, and extending into the first opening in the first polymer layer, wherein the second polymer interfaces a sidewall and a top surface of the first portion of the PPI within the first opening;
   a third polymer layer over the second polymer layer; and
   a bump structure spaced a distance from the PPI, wherein the bump structure extends into a second opening in the first, the second, and the third polymer layers, wherein the bump structure includes an under-bump metallurgy (UBM) layer is disposed between a bump and the second metal pad, and the third polymer layer is between the bump and the second polymer layer.

10. A wafer-level chip scale package (WLCSP), comprising:
a single die having a first terminal edge and an opposing second terminal edge and a top surface;
a stack of layers disposed on the top surface of the single die, the stack of layers including a passivation layer disposed directly on the top surface, a first polymer layer over the passivation layer, and a second polymer layer over the first polymer layer;
a plurality of bump structures on the single die between the first and second terminal edges, wherein the plurality of bump structures comprises:
a first portion of the plurality of bump structures within a first radius from a center of the die has a first bump structure, wherein a bump of the first portion of the plurality of bump structures extends through the second polymer layer, and wherein the bump of the first plurality of bump structures does not extend through the first polymer layer, such that the first polymer layer, the passivation layer, and the top surface of the single die each vertically underlie the bump of the first plurality of bump structures, and
a second portion of the plurality of bump structures between the first radius and a second radius from the center of the die has a second bump structure, wherein the second radius is larger than the first radius, a bump of the second portion of the plurality of bump structures extends through the second polymer layer and the first polymer and through an opening in the passivation layer such that the bump of the second portion of the plurality of bump structures interfaces a bond pad disposed directly on the top surface of the single die.

11. The WLCSP of claim 10, further comprising:
a first metal pad directly on the top surface of the substrate, and wherein the bump of the second portion of the plurality of bump structures interfaces with the first metal pad; substrate; and
a second metal pad directly on a top surface of the first polymer layer, wherein the bump of the first portion of the plurality of bump structures interfaces with the second metal pad.

12. The WLCSP of claim 10, wherein the semiconductor substrate has active devices and interconnects for connecting the active devices.

13. The WLCSP of claim 10, wherein the bump of the second portion of the plurality of bump structures includes:
a metal pad disposed on the top surface of substrate; and
wherein the bump of the second portion of the plurality of bump structures is disposed at a corner of the single die.

14. The semiconductor device of claim 9, wherein the third polymer layer does not contact the first portion of the first PPI structure.

15. The semiconductor device of claim 9, wherein a second portion of the PPI has a top surface having an interface with the third polymer layer and the second portion of the PPI has a first region with a bottom surface interfacing a top surface of the second polymer layer and a second region with the bottom surface interfacing a top surface of the first portion of the PPI.

16. The semiconductor device of claim 15 wherein the first portion of the PPI has an interface with a bottom surface of the second polymer layer and the metal pad.

17. The semiconductor device of claim 9, further comprising second bump structure interfacing a third metal pad, wherein the third metal pad is disposed over the second polymer layer.

18. The semiconductor device of claim 1, further comprising: a second PPI disposed between the UBM and first metal pad, wherein the second PPI interfaces the first metal pad, the first polymer layer, and the second polymer layer.

19. The semiconductor device of claim 9, further comprising: a second PPI disposed between the UBM and another metal pad, wherein the second PPI interfaces the another metal pad, the first polymer layer, and the second polymer layer.

20. The semiconductor device of claim 1, further comprising: another bump structure interfacing a third bond pad, wherein the third bond pad is disposed directly on a top surface of the second polymer layer, and wherein the another bump structure extends through another opening in the third polymer layer.

* * * * *